(12) United States Patent
Zhao et al.

(10) Patent No.: US 9,711,726 B2
(45) Date of Patent: Jul. 18, 2017

(54) MASK PLATE, METHOD FOR PROCESSING ORGANIC LAYER AND METHOD FOR FABRICATING DISPLAY SUBSTRATE

(71) Applicant: BOE TECHNOLOGY GROUP CO., LTD., Beijing (CN)

(72) Inventors: Dejiang Zhao, Beijing (CN); Jiaqi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 14/437,001

(22) PCT Filed: Nov. 11, 2014

(86) PCT No.: PCT/CN2014/090801
§ 371 (c)(1),
(2) Date: Apr. 20, 2015

(87) PCT Pub. No.: WO2015/131538
PCT Pub. Date: Sep. 11, 2015

(65) Prior Publication Data
US 2016/0254452 A1    Sep. 1, 2016

(30) Foreign Application Priority Data
Mar. 3, 2014 (CN) .......................... 2014 1 0074933

(51) Int. Cl.
*H01L 21/00* (2006.01)
*H01L 51/00* (2006.01)
(Continued)

(52) U.S. Cl.
CPC ...... *H01L 51/0018* (2013.01); *H01L 51/5228* (2013.01); *H01L 51/56* (2013.01);
(Continued)

(58) Field of Classification Search
CPC .............. H01L 27/1288; H01L 27/127; H01L 21/32139; H01L 51/0018; H01L 51/5228; H01L 51/56
See application file for complete search history.

(56) References Cited

U.S. PATENT DOCUMENTS 5,134,965 A * 8/1992 Tokuda ............. C23C 16/45502
118/715
7,172,912 B2 * 2/2007 Toyoda ..................... B41M 5/24
257/E21.347
(Continued)

FOREIGN PATENT DOCUMENTS

CN        2349218 Y    11/1999
CN        1582093 A    2/2005
(Continued)

OTHER PUBLICATIONS

Search Report issued in International Application No. PCT/CN2014/090801 mailed Feb. 10, 2015 (Feb. 10, 2015).
(Continued)

*Primary Examiner* — Richard Booth
(74) *Attorney, Agent, or Firm* — Nath, Goldberg & Meyer; Joshua B. Goldberg

(57) ABSTRACT

The present invention provides a mask plate, a method for processing an organic layer and a method for fabricating an organic light-emitting diode display substrate. The mask plate comprises a light transmitting region and a light shading region. The light transmitting region corresponds to a region of an organic layer to be removed. The light transmitting region is provided with a photothermal conversion material for converting light energy into heat energy. The light shading region is provided with a light blocking layer for blocking transmission of light. The mask plate is suitable for processing an organic layer and particularly
(Continued)

suitable for forming an auxiliary via hole in an organic light-emitting layer of an organic light-emitting diode display substrate.

15 Claims, 3 Drawing Sheets

(51) Int. Cl.
    *H01L 51/52*     (2006.01)
    *H01L 51/56*     (2006.01)
    *H01L 27/32*     (2006.01)

(52) U.S. Cl.
    CPC .... *H01L 27/3244* (2013.01); *H01L 2227/323* (2013.01); *H01L 2251/5315* (2013.01)

(56) References Cited

U.S. PATENT DOCUMENTS

2006/0073406 A1     4/2006    Kang et al.
2012/0295415 A1     11/2012    Ono
2012/0329123 A1*   12/2012    Nakashima ............ C12M 25/14
                                                                                                                                                            435/173.9

FOREIGN PATENT DOCUMENTS

| CN | 202522841 U | 11/2012 |
|---|---|---|
| CN | 103182877 A | 7/2013 |
| CN | 103882374 A | 6/2014 |
| GB | 1 604 525 A | 12/1981 |
| JP | 11-352670 A | 12/1999 |
| JP | 2011047048 A | 3/2011 |

OTHER PUBLICATIONS

Xin, et al., "Fabrication of 100 nm mask by laser interference lithography", High Power Laser and Particle Beams, China Academic Journal Electronic Publishing House, Mar. 2011, vol. 23, No. 3, http://www.cnki.net.

1st office action issued in Chinese application No. 201410074933.5 dated Aug. 27, 2015.

* cited by examiner

MASK PLATE, METHOD FOR PROCESSING ORGANIC LAYER AND METHOD FOR FABRICATING DISPLAY SUBSTRATE

This is a National Phase Application filed under 35 U.S.C. 371 as a national stage of PCT/CN2014/090801 filed on Nov. 11, 2014, an application claiming the benefit to Chinese application No. 201410074933.5 filed on Mar. 3, 2014; the content of each of which is hereby incorporated by reference in its entirety.

FIELD OF THE INVENTION

The present invention relates to the field of organic layer processing technology, in particular to a mask plate, a method for processing an organic layer and a method for fabricating an organic light-emitting diode display substrate.

BACKGROUND OF THE INVENTION

Organic Light-Emitting Diodes (OLEDs), due to their advantages of high contrast ratio, small thickness, wide angle of view, quick response, broad range of operating temperature, are applied more and more widely.

As shown in FIG. 1, an organic light-emitting diode display device includes an organic light-emitting diode display substrate 2. Each pixel unit of the organic light-emitting display substrate 2 is provided with an organic light-emitting diode comprising an anode 22, an organic light-emitting layer 23 and a cathode 24 which are sequentially arranged on a substrate 21. The anodes 22 of the organic light-emitting diodes are separated from one another and controlled by a thin film transistor array, and the organic light-emitting layer 23 and the cathode 24 of each organic light-emitting diode are integrally connected. The organic light-emitting layer 23 may include a Hole Injection Layer (HIL), a Hole Transfer Layer (HTL), an organic light-emitting material layer, an Electron Transfer Layer (ETL), an Electron Injection Layer (EIL) and other layer structure, and the cathode may be made from metal.

For a top emission type organic light-emitting diode display device, as its cathode 24 is required to be light-transmissive, the thickness of the cathode is relatively small so that the resistance thereof is relatively high. For this reason, an auxiliary electrode 25 may be provided on the substrate 21. The auxiliary electrode 25 may be in a latticed shape and is not electrically connected to the anode 22 or other structure. The cathode 24 may be connected to the latticed auxiliary electrode 25 through an auxiliary via hole 231 in the organic light-emitting layer 23, so that the resistance is reduced.

In fabricating the organic light-emitting diode display substrate 2 with the auxiliary electrode 25, in an existing method, a fine metal mask (FFM) plate is used in forming an organic light-emitting layer 23 by evaporation, so that an auxiliary via hole 231 is directly formed in the organic light-emitting layer 23 while forming the organic light-emitting layer 23 and the cathode 24 which is formed subsequently may be connected to the auxiliary electrode 25 through the auxiliary via hole 231.

The inventor has found at least the following problems in the prior art: the organic light-emitting layer of the organic light-emitting diode display substrate is of a multi-layer structure, and therefore multiple evaporations need to be performed; however, it can hardly ensure that the position of a fine metal mask plate is absolutely accurate during the multiple evaporations, so that the previously formed auxiliary via hole may be covered in the subsequent evaporation; in addition, for patterns having very high accuracy, the pattern of the fine metal mask plate is very small, and is likely to be blocked in the evaporation. In short, the existing method for forming the auxiliary via hole has high difficulty and low yield.

SUMMARY OF THE INVENTION

The technical problem to be solved by the present invention is, in view of the problem that the existing fabrication of an auxiliary via hole in a light-emitting layer of an organic light-emitting diode display substrate has high difficulty and low yield, to provide a mask plate, with which an accurate processing can be effectively performed on an organic layer, a method for processing an organic layer and a method for fabricating an organic light-emitting diode display substrate.

According to one aspect of the present invention, there is provided a mask plate, including a light transmitting region and a light shading region, the light transmitting region corresponding to a region of an organic layer to be removed. The light transmitting region is provided with a photothermal conversion material for converting light energy into heat energy. The light shading region is provided with a light blocking layer for blocking transmission of light.

According to an embodiment of the present invention, the photothermal conversion material may be any one of indocyanine green, polyaniline, carbon nano-material and noble metal nano-material. The carbon nano-material is any one of carbon nanotube, graphene and reductive graphene. The noble metal nano-material is nanogold or nanopalladium.

According to an embodiment of the present invention, a thickness of the photothermal conversion material may be in a range of 30 nm to 600 nm According to an embodiment of the present invention, a heat conducting structure may be provided on the photothermal conversion material for conducting heat generated by the photothermal conversion material. The heat conducting structure may be made of any one of titanium, gold and platinum. A thickness of the heat conducting structure may be in a range of 20 nm to 1000 nm.

According to an embodiment of the present invention, the light blocking layer may be made from a black photoresist material.

According to an embodiment of the present invention, the mask plate may further include a transparent substrate. Both the photothermal conversion material and the light blocking layer may be provided on the transparent substrate.

According to an embodiment of the present invention, the mask plate may be in a cylindrical shape. The photothermal conversion material may be located on an outer side of the cylindrical mask plate.

According to an embodiment of the present invention, the mask plate may further include a gas guide groove located in the light shading region and connected to the light transmitting region.

According to another aspect of the present invention, there is provided a method for processing an organic layer, including steps of: allowing one side of the mask plate of the present invention having the photothermal conversion material to contact the organic layer; and, irradiating the mask plate with laser to heat up the photothermal conversion material so that heat energy generated by the photothermal conversion material evaporates a portion of the organic layer corresponding to the light transmitting region.

According to an embodiment of the present invention, a heat conducting structure configured to contact with the organic layer may be provided on the photothermal conversion material.

According to an embodiment of the present invention, laser having a wavelength of 300 nm to 2000 nm and an energy density of 1-20 J/cm$^2$ may be used for irradiating, and irradiating time may be less than 300 seconds.

According to another aspect of the present invention, there is provided a method for fabricating an organic light-emitting diode display substrate, including steps of: forming an auxiliary electrode on a substrate; forming an organic light-emitting layer; allowing one side of the mask plate of the present invention with the photothermal conversion material thereon to contact the organic light-emitting layer; irradiating the mask plate with laser to heat up the photothermal conversion material so that heat energy generated by the photothermal conversion material evaporates a portion of the organic light-emitting layer corresponding to the light transmitting region, so as to form an auxiliary via hole in the organic light-emitting layer, wherein the auxiliary via exposes an upper surface of the auxiliary electrode; and, forming a cathode, which is connected to the auxiliary electrode through the auxiliary via.

According to an embodiment of the present invention, a heat conducting structure configured to contact with the organic light-emitting layer may be provided on the photothermal conversion material.

According to an embodiment of the present invention, the organic light-emitting diode display substrate may be a top emission type organic light-emitting diode display substrate.

The mask plate according to the present invention is divided into a light shading region and a light transmitting region, and the light transmitting region is provided with a photothermal conversion material. Therefore, after the photothermal conversion material comes into contact with an organic layer (for example, an organic light-emitting layer) to be processed, the photothermal conversion material on the mask plate may be heated up by irradiating the mask plate with laser, so that the organic layer in contact with the photothermal conversion material can be evaporated and thus removed. As the laser cannot transmit through the light shading region, a portion of the organic layer corresponding to the shading region is reserved. In this way, the organic layer may be allowed to form a desired pattern (for example, an auxiliary via hole arranged in a predetermined pattern formed in the organic light-emitting layer). When the mask plate provided by the present invention is used to process an organic layer, the organic layer is formed at first, then the undesired portion is removed to form the desired pattern, and therefore, it is not required to perform alignment for multiple times. Accordingly, the processing accuracy is improved, the technical difficulty is reduced, and the product yield is improved. Therefore, the mask plate according to the present invention may be suitable for processing an organic layer and particularly suitable for forming an auxiliary via hole in an organic light-emitting layer of an organic light-emitting diode display substrate.

DETAILED DESCRIPTION OF THE EMBODIMENTS

Figure 1:
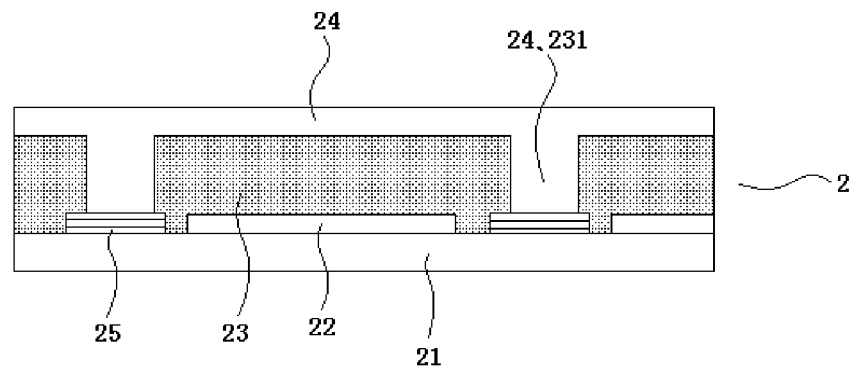
FIG. 1 is a sectional diagram of a structure of an organic light-emitting diode display substrate.

To make those skilled in the art better understand the technical solutions of the present invention, the present invention will be further described in detail below in conjunction with the drawings and specific embodiments.

FIGS. 2 to 5 show sectional diagrams of structures of mask plates according to embodiments of the present invention.

As shown in FIGS. 2 to 5, the mask plate 1 according to the embodiments of the present invention includes a light transmitting region 12 and a light shading region 11. The mask plate 1 may be used to remove a specific portion of an organic layer (for example, an organic light-emitting layer of an organic light-emitting diode display substrate), so that the remaining organic layer forms a desired pattern (for example, an auxiliary via hole arranged in a predetermined pattern formed in the organic light-emitting layer).

The light shading region 11 may be provided with a light blocking layer 111 for blocking transmission of light. The light blocking layer 111 may be made of a resin material having a low light absorptivity or a material having a high reflectivity. According to an embodiment of the present invention, the light blocking layer 111 may be made from a black photoresist material, e.g., material forming 'Black Matrix (BM)' in a liquid crystal display device. This material is generally formed by an alkali-soluble resin and a black pigment. According to an embodiment of the present invention, a black photoresist material having good heat resistance may be employed.

The light transmitting region 12 allows transmission of light and is provided with a photothermal conversion material 121. The pattern of the light transmitting region 12 corresponds to the pattern of a portion of the organic layer to be removed. The photothermal conversion material 121 refers to a material capable of receiving light energy and converting the light energy into heat energy. The photothermal conversion material 121 may be a carbon nano-material or a noble metal nano-material, i.e., a material formed from carbon or noble metal having a nanometer-scale size at least in one dimension. The noble metal includes gold, silver and metals in platinum group. The carbon nano-material may be any one of carbon nanotube, graphene and reductive graphene. The noble metal nano-material may be nanogold or nanopalladium (also called 'palladium blue'). In addition, the photothermal conversion 121 may also be indocyanine green, polyaniline or the like.

As the light transmitting region 12 is provided the photothermal conversion material 121, when using the mask plate 1, as long as one side of the mask plate 1 having the photothermal conversion material 121 comes into contact with an organic layer and the mask plate 1 is irradiated with laser from the other side of the mask plate 1, the photothermal conversion material 121 can be heated up after being irradiated, so as to evaporate a portion of the organic layer (i.e., a portion of the organic layer corresponding to the light transmitting layer 12) in contact with the photothermal conversion material. As the laser is blocked by the light blocking layer 111 at the shading region 11, a portion of the organic layer corresponding to the shading region 11 will not be irradiated or heated, so that this portion of organic layer is reserved. As a result, the portion of the organic layer corresponding to the light transmitting region 12 is removed to form the desired pattern.

The mask plate 1 may be in various forms. For example, as shown in FIG. 2, the mask plate 1 may include a transparent substrate 19 (for example, a glass plate), a light blocking layer 111 is provided in the shading region 11 of the transparent substrate 19, and the light transmitting region 12 is provided with photothermal conversion material 121.

Figure 2:
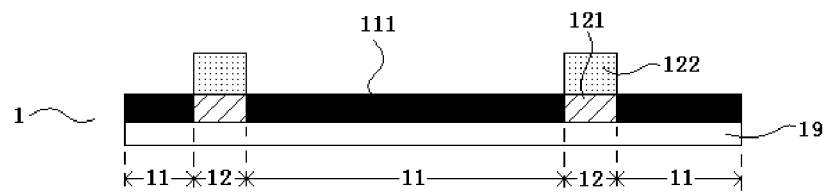
FIGS. 2 to 5 are sectional diagrams of structures of mask plates according to embodiments of the present invention.
Figure 3:
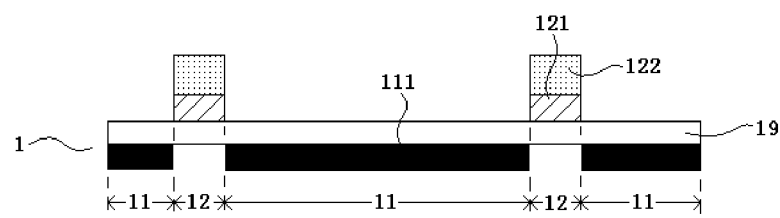
Figure 4:
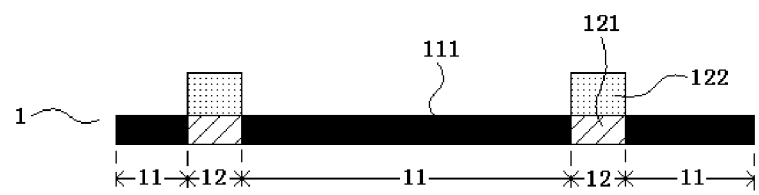

As shown in FIG. 2, both the light blocking layer 111 and the photothermal conversion material 121 may be disposed on a same side of the transparent substrate 19. As shown in FIG. 3, the light blocking layer 111 and the photothermal conversion material 121 may be disposed on both sides of the transparent substrate 19, respectively. As shown in FIG. 4, the substrate may be made of a nontransparent material. The substrate is hollowed out at the position of the light transmitting region 12, and the hollowed-out position is filled with the photothermal conversion material 121. Thus, the hollowed-out position filled with the photothermal conversion material 121 forms the light transmitting region 12, while a non-hollowed-out position forms the light shading region 11. The substrate itself forming the light shading region 11 is a light blocking layer 111.

The mask plate 1 formed in any form is the mask plate to be protected by the present invention, as long as the mask plate 1 includes the light transmitting region 12 provided with the photothermal conversion material 121 and the light shading region 11 provided with the light blocking layer 111.

The thickness of the photothermal conversion material 121 may be in the range of 30 nm to 600 nm. If the thickness of the photothermal conversion material 121 is too large, the heat conductivity may be influenced; however, if the thickness of the photothermal conversion material is too small, laser may pass through the photothermal conversion material 121 and then directly irradiate on the organic layer, so that the organic layer is damaged. The above range of the thickness of the organic layer is a preferred range of the thickness.

In addition, a heat conducting structure 122 may be provided on the photothermal conversion material 121 for conducting heat generated by the photothermal conversion material 121.

Although the photothermal conversion material 121 can convert light energy into heat energy, the heat conductivity of the photothermal conversion material may not be good. Therefore, the heat conducting structure 122 having good heat conductivity may be provided on the photothermal conversion material 121, so that heat is better transferred to the organic layer through the heat conducting structure 122.

The material of the heat conducting structure 122 may be any one of titanium, gold and platinum. That is, the material of the heat conducting structure 122 may be a heat conducting metal having good corrosion resistance. The thickness of the heat conducting structure 122 may be 20 nm to 1000 nm. When the thickness of the heat conducting structure 122 is small, the heat conducting structure may be directly adhered to a surface of the organic layer for heat conducting. When the thickness of the heat conducting structure 122 is large, the heat conducting structure may be 'inserted' into the organic layer for better heat conducting.

Figure 5:
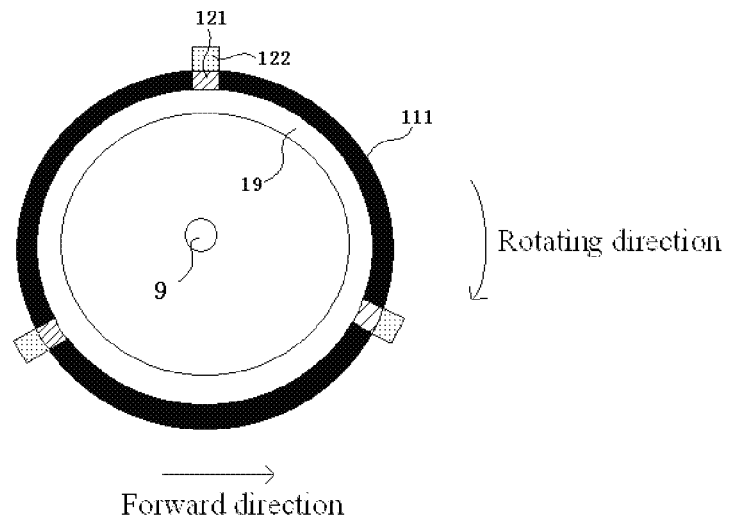

As shown in FIG. 5, the mask plate 1 may be in a cylindrical shape, and the photothermal conversion material 121 (and the heat conducting structure 122) may be located on an outer side of the cylindrical mask plate 1.

When the mask plate according to the embodiment of the present invention is used to process an organic layer, the organic layer needs to be evaporated. If gas generated by the evaporated organic layer cannot be discharged in time, the normal implementation of the process will be influenced. For this reason, as shown in FIG. 5, the mask plate 1 may be manufactured to be in a cylindrical shape, and a strip-shaped laser light source 9 is disposed inside the cylindrical mask plate 1 to emit light towards the surrounding. The cylindrical mask plate 1 may roll forward during operation, and the laser light source 9 also synchronously goes forward along with the mask plate 1. Using the cylindrical mask plate to process the organic layer may facilitate discharging the gas generated by the evaporated organic layer in time.

According to an embodiment of the present invention, a gas guide groove (not shown) connected to the light transmitting region 12 may further be provided in the light shading region 11 of the mask plate 1. For example, the gas guide groove connected to the light transmitting region 12 may be provided in the light blocking layer 111 or in the transparent substrate 19, so that the gas generated by the evaporated organic layer may be discharged in time, and the influence on the process is thus reduced.

FIG. 6 to FIG. 10 are sectional diagrams of steps in a method for fabricating an organic light-emitting diode display substrate according to an embodiment of the present invention.

Figure 6:
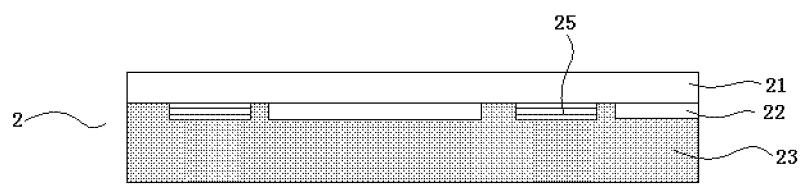
FIGS. 6 to 10 are sectional diagrams illustrating steps in a method for fabricating an organic light-emitting diode display substrate, according to an embodiment of the present invention.

Referring to FIG. 6, a sectional diagram of an organic light-emitting diode display substrate 2 to be processed is shown. The organic light-emitting diode display substrate 2 to be processed includes a substrate 21 and an anode 22, an auxiliary electrode 25 and an organic light-emitting layer 23 covering the anode 22 and the auxiliary electrode 25 formed on the substrate.

The organic light-emitting layer 23 may include a hole injection layer, a hole transfer layer, an organic light-emitting material layer, an electron transfer layer, an electron injection layer and the like, and may be formed by several evaporations. An auxiliary via hole may be formed in the organic light-emitting layer 23 by using the mask plated according to the embodiments of the present invention. The steps of the method for fabricating an organic light-emitting diode display substrate will be described below by taking the mask plate 1 shown in FIG. 2 as an example, but the conception of the present invention is not limited thereto. In addition, the organic light-emitting diode display substrate 2 to be processed may further include other structures, for example, thin film transistors, gate lines, data lines, a pixel defining layer and the like, and these structures will not be enumerated herein.

Figure 7:
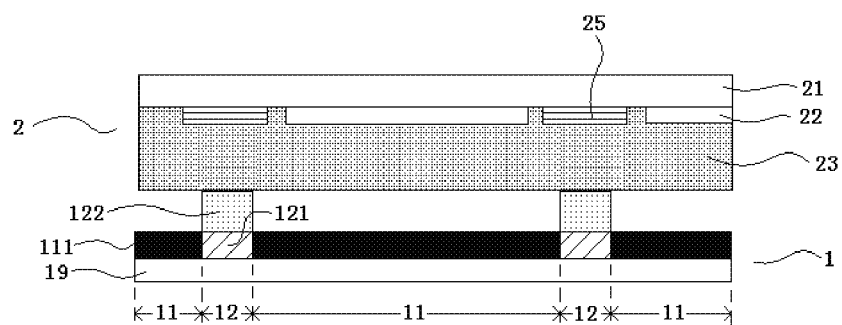

Referring to FIG. 7, one side of the mask plate 1 with the photothermal conversion material 121 provided thereon is allowed to contact the organic light-emitting layer 23. When a heat conducting structure 122 is provided on the photothermal conversion material 121, the heat conducting structure 122 is allowed to contact the organic light-emitting layer 23.

Figure 8:
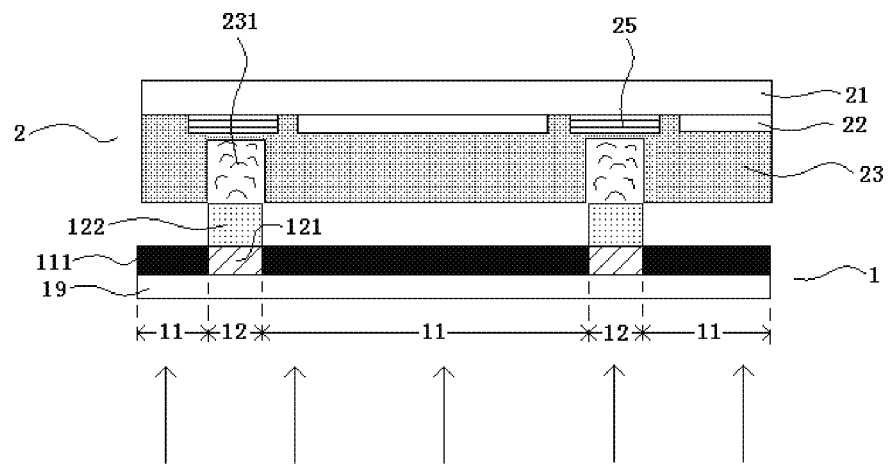

Referring to FIG. 8, the mask plate 1 is irradiated with laser from the other side of the mask plate 1 to heat up the photothermal conversion material 121. Heat energy generated by the photothermal conversion material 121 can evaporate a portion of the organic light-emitting layer 23 corresponding to the light transmitting region 12 to form an auxiliary via hole 231 in the organic light-emitting layer 23. The auxiliary via hole 231 may expose an upper surface of the auxiliary electrode 25.

Laser having a wavelength of 300 nm to 2000 nm and an energy density of 1-20 $J/cm^2$ may be used for irradiating, and the irradiating time may be less than 300 seconds.

Those skilled in the art may select various parameters of the laser for processing according to actual requirements, as long as a portion of the organic layer corresponding to the light transmitting region 12 can be fully evaporated and a portion of the organic layer corresponding to the light shading region 11 is not influenced.

Figure 9:
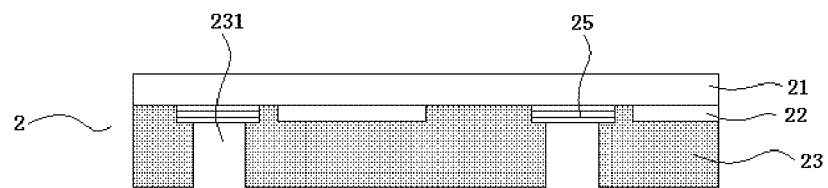

The mask plate 1 is removed, and the gas generated by the evaporated organic light-emitting layer 23 is discharged, so as to obtain the structure shown in FIG. 9.

Figure 10:
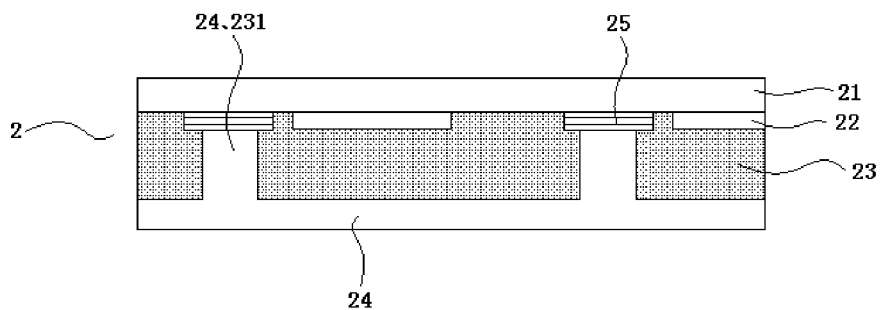

Referring to FIG. 10, a cathode 24 connected to the auxiliary electrode 25 through the auxiliary via hole 231 is formed. The cathode 24 may be formed by evaporation or other process. As the auxiliary via hole 231 has been formed in the organic light-emitting layer 23, the cathode 24 may fill the auxiliary via hole 231 and is electrically connected to the auxiliary electrode 25.

According to an embodiment of the present invention, the organic light-emitting diode display substrate 2 may be a top emission type organic light-emitting diode display substrate. That is, the cathode 24 of the organic light-emitting diode display substrate 2 is thin and allows transmission of light. In addition, a reflective layer (not shown) may be further provided between the organic light-emitting layer 23 and the substrate 21, so that light emitted from the organic light-emitting layer 23 is only emitted out through the cathode 24.

As the cathode 24 of the top emission type organic light-emitting diode display substrate is required to be light-transmissive, the thickness of the cathode is relatively small, so that the resistance thereof is high. Thus, the resistance can be decreased by the use of the auxiliary electrode 25. An auxiliary via hole 231 may be formed in the organic light-emitting layer 23 by using the mask plate according to the embodiments of the present invention, so as to allow the cathode 24 to be electrically connected to the auxiliary electrode 25 through the auxiliary via hole 231, so that the purpose of decreasing resistance is achieved. However, the conception of the present invention is not limited thereto. The mask plate according to the embodiments of the present invention may also be used to fabricate a bottom emission type organic light-emitting diode display substrate.

It should be understood that the foregoing embodiments are merely exemplary embodiments used for describing the principle of the present invention, but the present invention is not limited thereto. Those skilled in the art may make various variations and improvements without departing from the spirit and essence of the present invention, and these variations and improvements shall fall into the protection scope of the present invention.

The invention claimed is:

1. A mask plate, comprising a light transmitting region and a light shading region, the light transmitting region corresponding to a region of an organic layer to be removed, wherein
the light transmitting region is provided with a photothermal conversion material for converting light energy into heat energy; and
the light shading region is provided with a light blocking layer for blocking transmission of light,
wherein a heat conducting structure is provided on the photothermal conversion material for conducting heat generated by the photothermal conversion material, and
wherein the mask plate is in a cylindrical shape, and the photothermal conversion material is located on an outer side of the cylindrical mask plate.

2. The mask plate according to claim 1, wherein
the photothermal conversion material is any one of indocyanine green, polyaniline, carbon nano-material and noble metal nano-material.

3. The mask plate according to claim 2, wherein
the carbon nano-material is any one of carbon nanotube, graphene and reductive graphene; and
the noble metal nano-material is nanogold or nanopalladium.

4. The mask plate according to claim 1, wherein
a thickness of the photothermal conversion material is in a range of 30 nm to 600 nm.

5. The mask plate according to claim 1, wherein
the heat conducting structure is made of any one of titanium, gold and platinum.

6. The mask plate according to claim 1, wherein
a thickness of the heat conducting structure is in a range of 20 nm to 1000 nm.

7. The mask plate according to claim 1, wherein
the light blocking layer is made from a black photoresist material.

8. The mask plate according to claim 1, further comprising a transparent substrate, on which both the photothermal conversion material and the light blocking layer are provided.

9. The mask plate according to claim 1, further comprising a gas guide groove located in the light shading region and connected to the light transmitting region.

10. A method for processing an organic layer, comprising steps of:
allowing one side of the mask plate according to claim 1 having the photothermal conversion material to contact the organic layer; and
irradiating the mask plate with laser to heat up the photothermal conversion material so that heat energy generated by the photothermal conversion material evaporates a portion of the organic layer corresponding to the light transmitting region,
wherein a heat conducting structure configured to contact with the organic layer is provided on the photothermal conversion material.

11. The method for processing an organic layer according to claim 10, wherein
laser having a wavelength of 300 nm to 2000 nm and an energy density of 1-20 J/cm$^2$ is used for irradiating, and irradiating time is less than 300 seconds.

12. A method for fabricating an organic light-emitting diode display substrate, comprising steps of:
forming an auxiliary electrode on a substrate;
forming an organic light-emitting layer;
allowing one side of the mask plate according to claim 1 having the photothermal conversion material to contact the organic light-emitting layer;
irradiating the mask plate with laser to heat up the photothermal conversion material so that heat energy generated by the photothermal conversion material evaporates a portion of the organic light-emitting layer corresponding to the light transmitting region to form an auxiliary via hole in the organic light-emitting layer, wherein the auxiliary via hole exposes an upper surface of the auxiliary electrode; and
forming a cathode connected to the auxiliary electrode through the auxiliary via.

13. The method for fabricating an organic light-emitting diode display substrate according to claim 12, wherein a heat conducting structure configured to contact with the organic light-emitting layer is provided on the photo-thermal conversion material.

14. The method for fabricating an organic light-emitting diode display substrate according to claim 12, wherein the organic light-emitting diode display substrate is a top emission type organic light-emitting diode display substrate.

15. The method for fabricating an organic light-emitting diode display substrate according to claim 13, wherein the organic light-emitting diode display substrate is a top emission type organic light-emitting diode display substrate.

* * * * *